US012813246B2

(12) United States Patent
Huang et al.

(10) Patent No.: US 12,813,246 B2
(45) Date of Patent: Nov. 24, 2026

(54) SEMICONDUCTOR STRUCTURES WITH STACKED INTERCONNECTS

(71) Applicant: International Business Machines Corporation, Armonk, NY (US)

(72) Inventors: Huai Huang, Clifton Park, NY (US); Nicholas Anthony Lanzillo, Wynantskill, NY (US); Hosadurga Shobha, Niskayuna, NY (US); Ruilong Xie, Niskayuna, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 512 days.

(21) Appl. No.: 17/956,114

(22) Filed: Sep. 29, 2022

(65) Prior Publication Data

US 2024/0113013 A1 Apr. 4, 2024

(51) Int. Cl.

| | |
|---|---|
| ***H10W 20/42*** | (2026.01) |
| ***H10D 84/83*** | (2025.01) |
| ***H10W 20/00*** | (2026.01) |
| ***H10W 20/43*** | (2026.01) |
| ***H10W 90/00*** | (2026.01) |

(52) U.S. Cl.

CPC ............ *H10W 20/42* (2026.01); *H10D 84/83* (2025.01); *H10W 20/089* (2026.01); *H10W 20/43* (2026.01); *H10W 90/00* (2026.01)

(58) Field of Classification Search

CPC ... H10W 20/42; H10W 20/43; H10W 20/089; H10W 90/00; H10D 84/83

See application file for complete search history.

(56) References Cited

U.S. PATENT DOCUMENTS

| | | | | |
|---|---|---|---|---|
| 7,439,173 | B2 | 10/2008 | Greco et al. | |
| 8,026,606 | B2 | 9/2011 | Luce et al. | |
| 2003/0217462 | A1 | 11/2003 | Wang et al. | |
| 2009/0142924 | A1 | 6/2009 | Hu et al. | |
| 2009/0309223 | A1 | 12/2009 | Luce et al. | |
| 2010/0167526 | A1 | 7/2010 | Fu et al. | |
| 2015/0214093 | A1 | 7/2015 | Dordi et al. | |
| 2023/0069830 | A1 * | 3/2023 | Yew .................... | H10W 20/087 |

FOREIGN PATENT DOCUMENTS

| | | | |
|---|---|---|---|
| EP | 1032032 | A2 | 8/2000 |

OTHER PUBLICATIONS

K. Agashiwala et al., "Reliability and Performance of CMOS-Compatible Multi-Level Graphene Interconnects Incorporating Vias," IEEE International Electron Devices Meeting, Dec. 2020, 4 pages.

J. P. GAMBINO, "Improved Reliability of Copper Interconnects Using Alloying," 17th IEEE International Symposium on the Physical and Failure Analysis of Integrated Circuits, Jul. 2010, 7 pages.

* cited by examiner

*Primary Examiner* — Timor Karimy

(74) *Attorney, Agent, or Firm* — Kristofer Haggerty; Ryan, Mason & Lewis, LLP

(57) ABSTRACT

A semiconductor structure comprises a first portion of an interconnect line comprising a first conducting line segment and a second conducting line segment separated by an isolating layer, and a second portion of the interconnect line comprising a third conducting line segment vertically stacked over at least a portion of the first conducting line segment and at least a portion of the second conducting line segment.

16 Claims, 5 Drawing Sheets

SEMICONDUCTOR STRUCTURES WITH STACKED INTERCONNECTS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming semiconductor structures with stacked interconnects.

In one embodiment, a semiconductor structure comprises a first portion of an interconnect line comprising a first conducting line segment and a second conducting line segment separated by an isolating layer, and a second portion of the interconnect line comprising a third conducting line segment vertically stacked over at least a portion of the first conducting line segment and at least a portion of the second conducting line segment.

In another embodiment, an interconnect structure comprises a stacked interconnect line, the stacked interconnect line comprising a first portion comprising two or more conducting line segments separated by an isolating layer and a second portion vertically stacked over the first portion, and one or more vias connecting the stacked interconnect line with an additional structure.

In another embodiment, an integrated circuit comprises a semiconductor structure comprising a first portion of an interconnect line comprising a first conducting line segment and a second conducting line segment separated by an isolating layer, and a second portion of the interconnect line comprising a third conducting line segment vertically stacked over at least a portion of the first conducting line segment and at least a portion of the second conducting line segment.

These and other features and advantages of embodiments described herein will become more apparent from the accompanying drawings and the following detailed description.

DETAILED DESCRIPTION

Figure 1A:
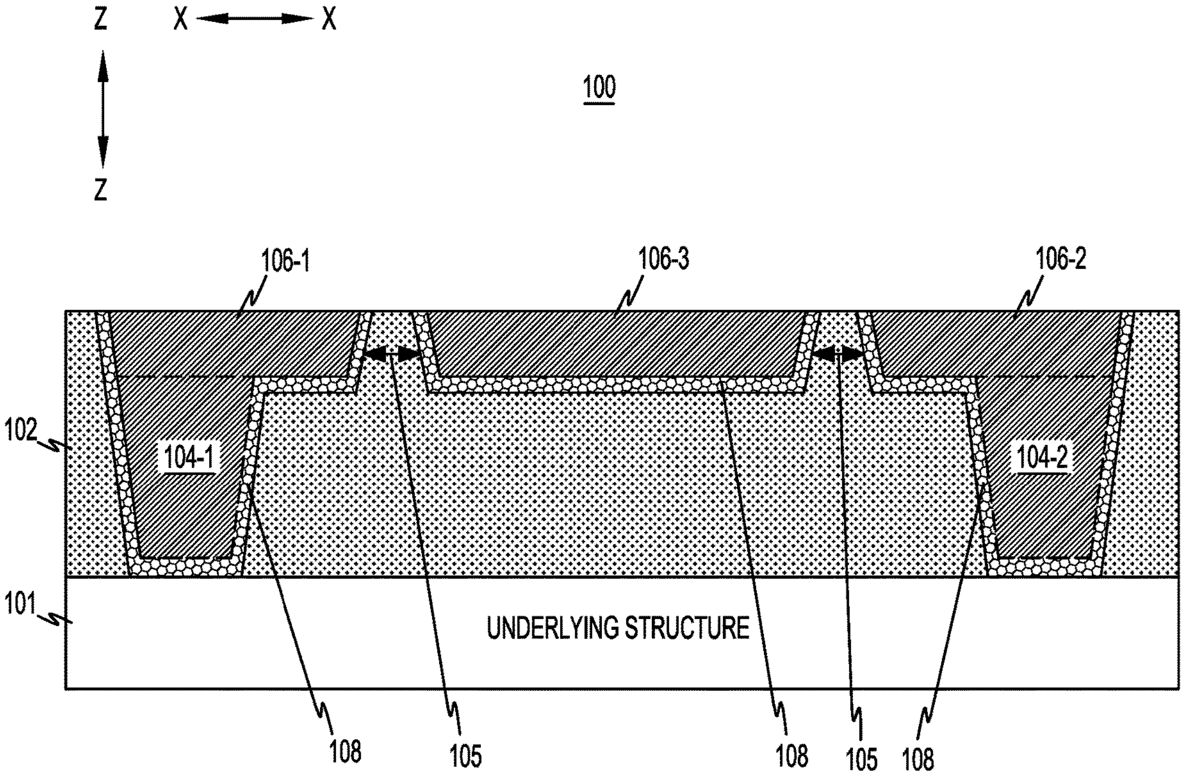
FIG. 1A depicts a side cross-sectional view of a structure following formation of a via level and a first portion of a metal line level, according to an embodiment of the invention.

Illustrative embodiments of the invention may be described herein in the context of illustrative methods for forming semiconductor structures with stacked interconnects, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

In semiconductor fabrication processes, a large number of semiconductor devices and conductive interconnect layers are formed in and on a single wafer or substrate. Such conductive interconnect layers provide a network of pathways that transport signals throughout an integrated circuit (e.g., connecting circuit components of an integrated circuit). Different interconnect layers may be connected to one another via a set of vias formed through the wafer. As feature sizes continue to decrease, the aspect ratio (e.g., a ratio height or depth to width) of features such as vias generally increases. It is difficult to fabricate complex structures with multiple interconnect layers and vias connecting such layers within increasingly smaller wafer footprints.

To fabricate very large scale integrated (VLSI) or ultra large scale integrated (VLSI) circuits, complex interconnect structures are required. Such interconnect structures may include a wiring interconnect network (e.g., of metallic wiring) for coupling different devices and features of devices to one another. The wiring interconnect network may include "line" features that traverse a distance across a level of a semiconductor structure, as well as "via" features that connect line features in different levels. The line features, also referred to as metal lines, may be formed of aluminum (Al), copper (Cu), tungsten (W) or another suitable material that is electrically insulated by interlayer dielectric (ILD) layers. The via features are referred to herein as being in "V" layers or levels of a semiconductor structure, while the line features are referred to as being in "M" layers or levels of the semiconductor structure.

To improve performance, the size of various features of a semiconductor structure (also referred to herein as a semiconductor chip) continue to scale. For example, transistor gate length and chip size overall continue to shrink. As a result, the interconnect structures must also shrink, which causes the aspect ratio of via features to generally increase. To improve manufacturability, lithography fabrication may utilize advanced masks that incorporate phase-shifting and optical proximity correction. As the size scale of interconnect structures decreases, overlay error between features in the interconnect structure can lead to various reliability issues. Overlay errors may result from misalignment during lithography processes, as the masks may become misaligned with the underlying structure. Although overlay errors can be reduced be re-working lithography operations, it is generally not feasible to entirely avoid some level of overlay error.

Various failure modes for interconnects may be a result of electro-migration (EM). EM failure is a result of a void forming in a conductive metal feature through metal diffusion, leading to a short or very high resistance. EM is highly dependent on a current density and cross-section of metal features. If interconnect wiring is constructed such that the intersections between vias and lines are too small, smaller voids formed by EM can lead to failure which shortens the EM lifetime.

EM may be a cause of malfunction of interconnects in integrated circuits. EM includes the physical motion of atoms out of areas where current density is high (e.g., resulting from frictional forces between metal ions and flowing electrons). EM may ultimately result in a break in a via or line. EM may be mitigated at least in part through the selection of the material used for vias and lines. For example, aluminum (Al) vias the and lines may exhibit lower EM than other materials such as copper (Cu). Thus, materials such as Cu are now predominantly used for vias and lines (more generally, for interconnects). Cu interconnects, however, are still subject to EM due to Cu diffusion during current flow. There is thus a need for increasing EM lifetime for back-end-of-line (BEOL) interconnects or other wirings.

EM performance of metal wires can be boosted by a short length effect, where the mass transport is halted by a blocking boundary. The increased stress near the blocking boundary generates a back-flow force, which compensates for the driving force of electron wind and mass transport, therefore prolonging the wire lifetime. When the length of the wire before the blocking boundary is short enough, the driving force is completely compensated by the back-flow stress and enables an immoral EM wiring lifetime independent of stress current and temperature.

Illustrative embodiments provide interconnect structures with vertically stacked metal lines (e.g., at the same line level). Such vertically stacked metal lines by themselves are isolated, but together form a continuous line in a given line level to permit current flow. To reduce the effects of EM, blocking boundaries are formed between different segments of the lines in the given line level. Such interconnect structures may be formed by forming voids in a dielectric layer (e.g., an interlayer dielectric (ILD) layer), the voids defining regions where a via level (e.g., a Vx-1 level) and first portions of a metal line level (e.g., an Mx(B) level) are to be formed. A barrier layer is then formed in the voids, followed by deposition of the interconnect material (e.g., Cu) for the via level (e.g., the Vx-1 level) and the first portions of the metal line level (e.g., the Mx(B) level). After planarization (e.g., of the Vx-/Mx(B) level) using chemical mechanical planarization (CMP) or other suitable processing, additional dielectric material is then formed and patterned over the first portion of the metal line level, and additional voids are formed in the "upper" additional dielectric material. The additional voids define regions were second portions of the metal line level (e.g., an Mx(A) level) are to be formed. A barrier layer is then formed in the additional voids, followed by interconnect material for the second portions of the metal line level (e.g., the Mx(A) level). The structure may then be planarized again (e.g., using CMP or other suitable processing).

Such stacked interconnect structures advantageously provide significantly improved EM characteristics, which enables large life stress current density (Juse) (e.g., using the short-length effect). The stacked interconnect structures also have no resistance penalty, due to the high aspect ratio (AR) and large contact areas. The stacked interconnect structures are also valuable in advanced node structures, enhancing EM characteristics without taking horizontal space, and can be used for subtractive interconnect schemes as well. The stacked interconnect structures may be used for front side and/or back side power distribution networks as well, where high Juse is critical.

FIGS. 1A-2B show a process flow for forming stacked interconnect structures. FIGS. 1A and 1B show a side cross-sectional view 100 and a top-down view 150, respectively, of a semiconductor structure following patterning of voids (e.g., opening or trenches) in a dielectric layer 102. Vias 104-1 and 104-2 (collectively, vias 104) of a via level (e.g., a V(x−1) via level) are formed in the voids, followed by a first portion of a line level (e.g., an Mx(B) portion of an Mx line level) including line segments 106-1, 106-2 and 106-3. A liner layer 108 (e.g., a protection layer, a barrier layer, a metal adhesion layer, combinations thereof, etc.) may be deposited in the voids first, followed by the fill of an interconnect material for the vias 104 and line segments 106-1, 106-2 and 106-3. The voids in the dielectric layer 102 may be formed using damascene processing, subtractive etch processing, etc. The vias 104-1 and 104-2 in the Vx-1 via level may be deliberately patterned with the line segments 106-1, 106-2 and 106-3 in the Mx(B) portion of the Mx line level so as to avoid requiring an additional via mask.

The dielectric layer 102 may comprise an interlayer dielectric (ILD), and may be formed of any suitable isolating material, such as silicon dioxide ($SiO_2$), silicon oxycarbide (SiOC), silicon oxynitride (SiON), etc. The dielectric layer 102 may have a width (in the X and Y directions) sufficient to cover the underlying structure 101 (e.g., which may include active devices, one or more additional line and via levels of additional interconnect structures, etc.).

The liner layer 108, which may also be referred to as a metal adhesion layer, a barrier layer or a protection layer, may be formed of various materials depending on the materials used for the vias 104 and the line segments 106-1, 106-2 and 106-3. The liner layer 108 may have a uniform thickness in the range of 0.3 nm to 10 nm. In some cases, the liner layer 108 may have a different bottom coverage than sidewall coverage due to the step effect or reverse bias effect. The liner layer 108 serves as a blocking boundary to the mass transport of low-resistance conductive metal inside the line segments 106-1, 106-2 and 106-3. The liner layer 108 may be formed of tantalum (Ta), tantalum nitride (TaN), a tantalum nitride and cobalt (TaN/Co) dual layer, a tantalum nitride and ruthenium (TaN/Ru) dual layer, a tantalum nitride and tantalum dual layer (TaN/Ta), etc.

The vias 104 and line segments 106-1, 106-2 and 106-3 may be formed of a low resistance metal such as copper (Cu), ruthenium (Ru), tungsten (W), cobalt (Co), rhodium (Rh), etc. The vias 104 may have widths (in the X direction) in the range of 5 nm to 10 micrometers (μall), and heights (in the Z direction) in the range of 5 nm to 10 μm. The line segments 106-1, 106-2 and 106-3 may have widths (in the X direction) in the range of 10 nm to 20 μm, and heights (in the Z direction) in the range of 10 nm to 5 μm. The spacing 105 between the line segments 106-1, 106-2 and 106-3 may be in the range of 5 nm to 1 μm.

Figure 1B:
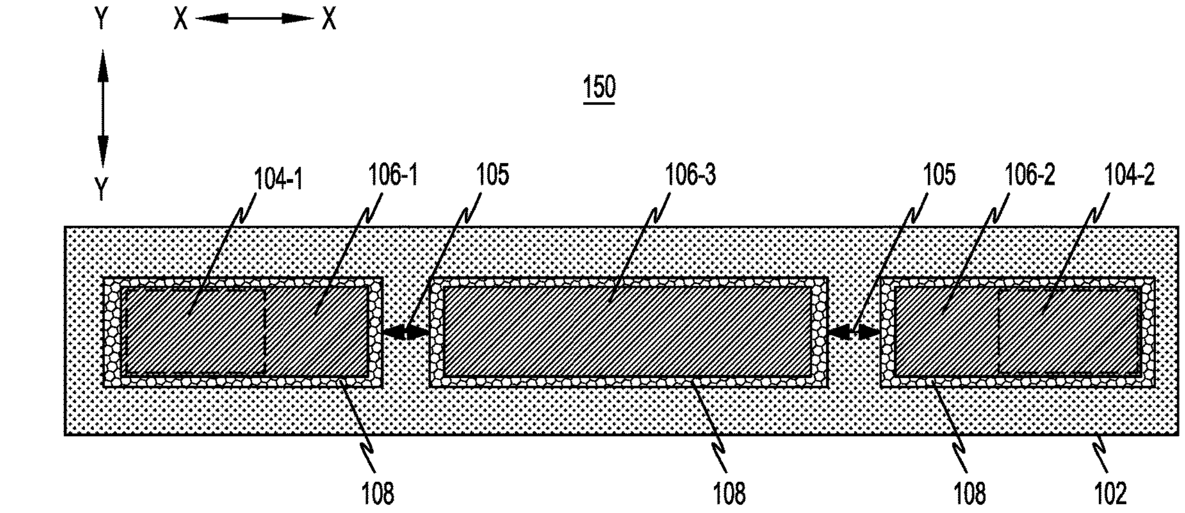
FIG. 1B depicts a top-down view of a structure following formation of a via level and a first portion of a metal line level, according to an embodiment of the invention.
Figure 2A:
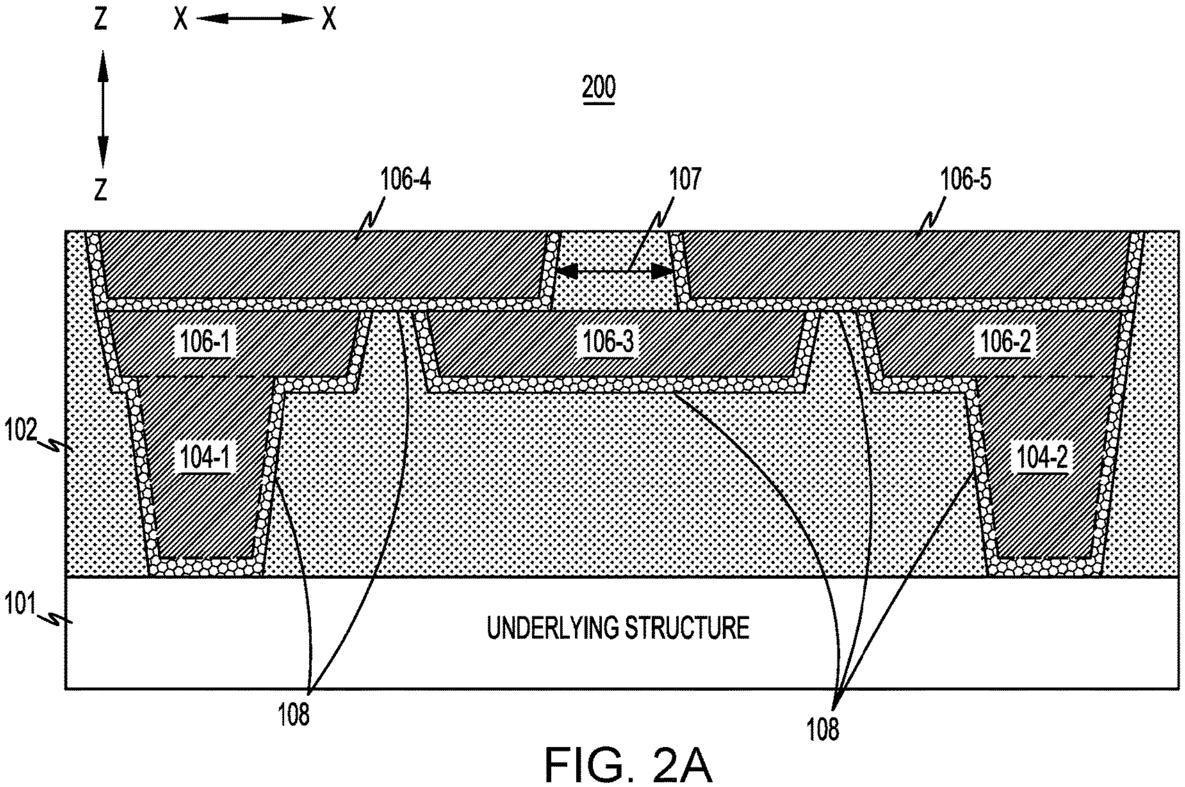
FIG. 2A depicts a side cross-sectional view of the structure of FIGS. 1A and 1B following formation of a second portion of the metal line level, according to an embodiment of the invention.
Figure 2B:
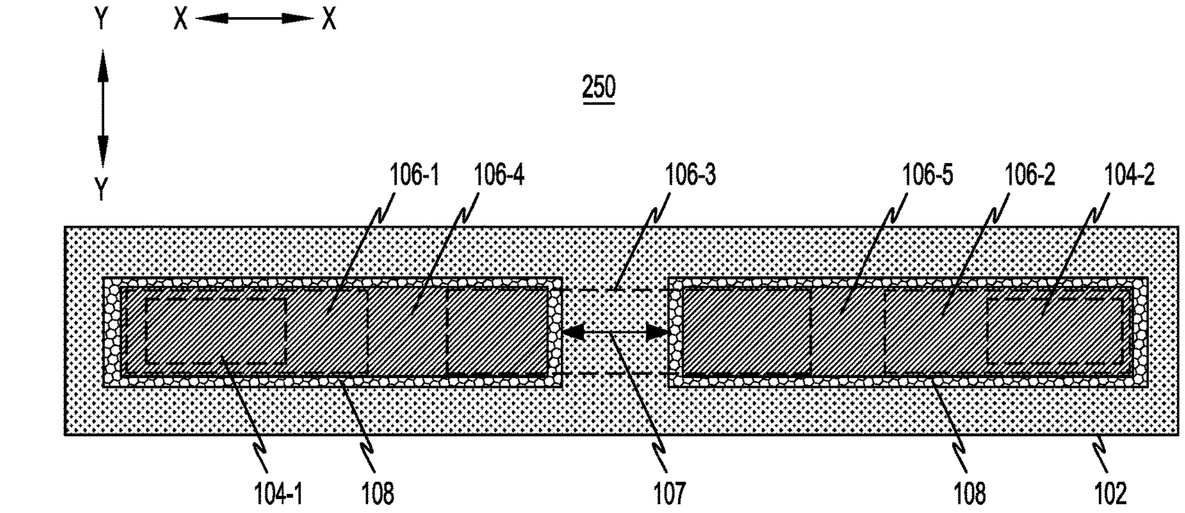
FIG. 2B depicts a top-down view of the structure of FIGS. 1A and 1B following the formation of the second portion of the metal line level, according to an embodiment of the invention.

FIGS. 2A and 2B show a side cross-sectional view 200 and a top-down view 250, respectively, of the semiconductor structure of FIGS. 1A and 1B following patterning of voids (e.g., opening or trenches) in the dielectric layer 102 for a second portions of a line level (e.g., an Mx(A) portion of the Mx line level) including line segments 106-4 and 106-5. Additional material for the dielectric layer 102 may first be deposited to overfill the structure of FIGS. 1A and 1B, followed by the formation of the voids for the line segments 106-4 and 106-5. Additional liner layer 108 may be deposited in the voids first, followed by fill of an interconnect material for the line segments 106-4 and 106-5 using processing similar to that described above with respect to the line segments 106-1, 106-2 and 106-3. The line segments 106-1, 106-2, 106-3, 106-4 and 106-5 (collectively, line segments 106) provide a single line level of an interconnect structure (e.g., the Mx line level).

The line segments 106-4 and 106-5 may be formed of similar materials as the line segments 106-1, 106-2 and 106-3. The line segments 106-4 and 106-5 may have widths (in the X direction) in the range of 50 nm to 20 μm, sufficient to connect adjacent ones of the line segments 106-1, 106-2 and 106-3 as illustrated. For example, the line segment 106-4 extends over portions of and connects the line segments 106-1 and 106-3. The line segment 106-5 extends over portions of and connects the line segments 106-2 and 106-3. Collectively, the line segments 106 enable interconnection from the via 104-1, to the line segment 106-1, to the line segment 106-4, to the line segment 106-3, to the line segment 106-5, to the line segment 106-2, and to the via 104-2, where the vias 104-1 and 104-2 may connect to different portions of the underlying structure 101 (e.g., to additional interconnect levels in the underlying structures, such as an Mx-1 line level and/or Vx-2 via level, to different portions of one or more active devices in the underlying structure 101, etc.). The spacing 107 between the line segments 106-4 and 106-5 may be in the range of 5 nm to 1 μm. Overlapping of the "upper" line segments 106-4 and 160-5 and the "lower" line segments 106-1, 106-2 and 106-3 can be maximized to reduce the overall line resistance.

Figure 3A:
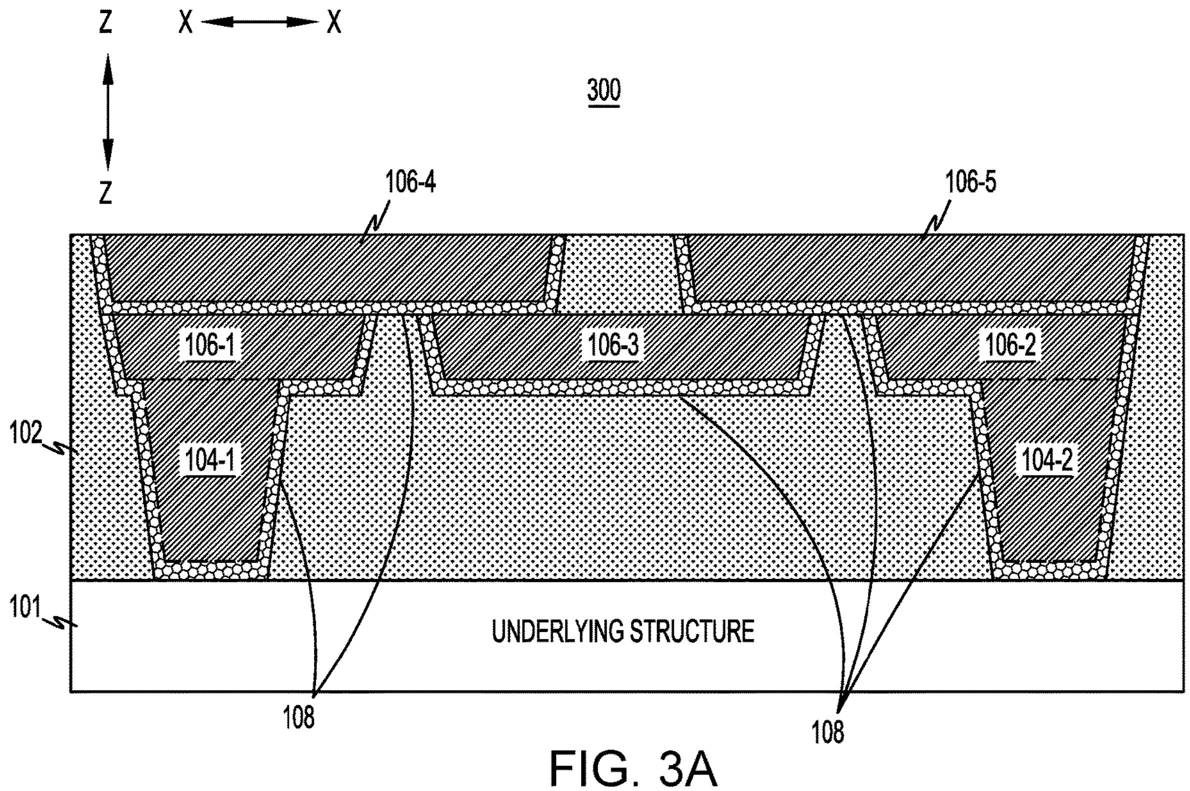
FIG. 3A depicts a side cross-sectional view of a structure with stacked interconnects in a metal line level, according to an embodiment of the invention.
Figure 3B:
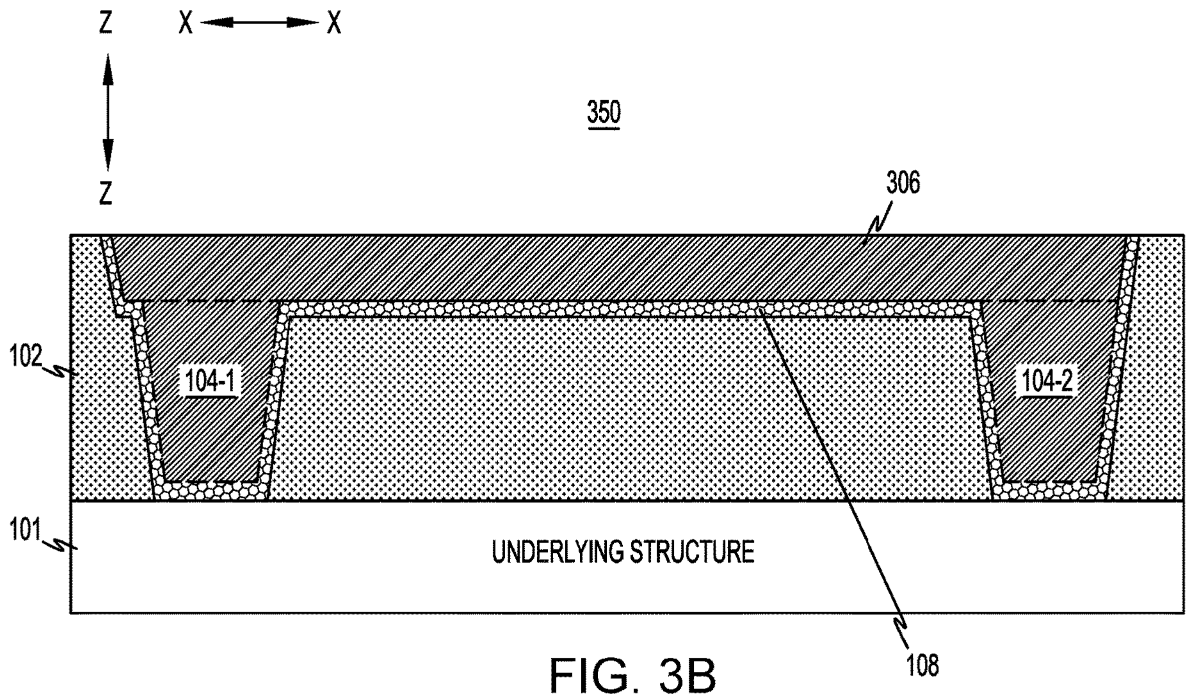
FIG. 3B depicts a side cross-sectional view of a structure with non-stacked interconnects in a metal line level, according to an embodiment of the invention.

The lengths of the line segments 106, in some embodiments, are selected so as to be shorter than a critical length (e.g., in the range of a few microns) to minimize EM effects. FIGS. 3A and 3B show respective side cross-sectional views 300 and 350 with and without the use of stacked interconnects, illustrating how the use of stacked interconnects can reduce or minimize EM effects. The side cross-sectional view 300 of FIG. 3A shows the structure of FIG. 2A, while the side cross-sectional view 350 of FIG. 3B shows a similar structure that uses a non-stacked interconnect for the Mx line level including only a single line segment 306 which connects the vias 104-1 and 104-2. As illustrated, the length of the line segment 306 is longer than each of the line segments 106, and thus the structure of FIG. 3B is more susceptible to EM effects.

Figure 4:
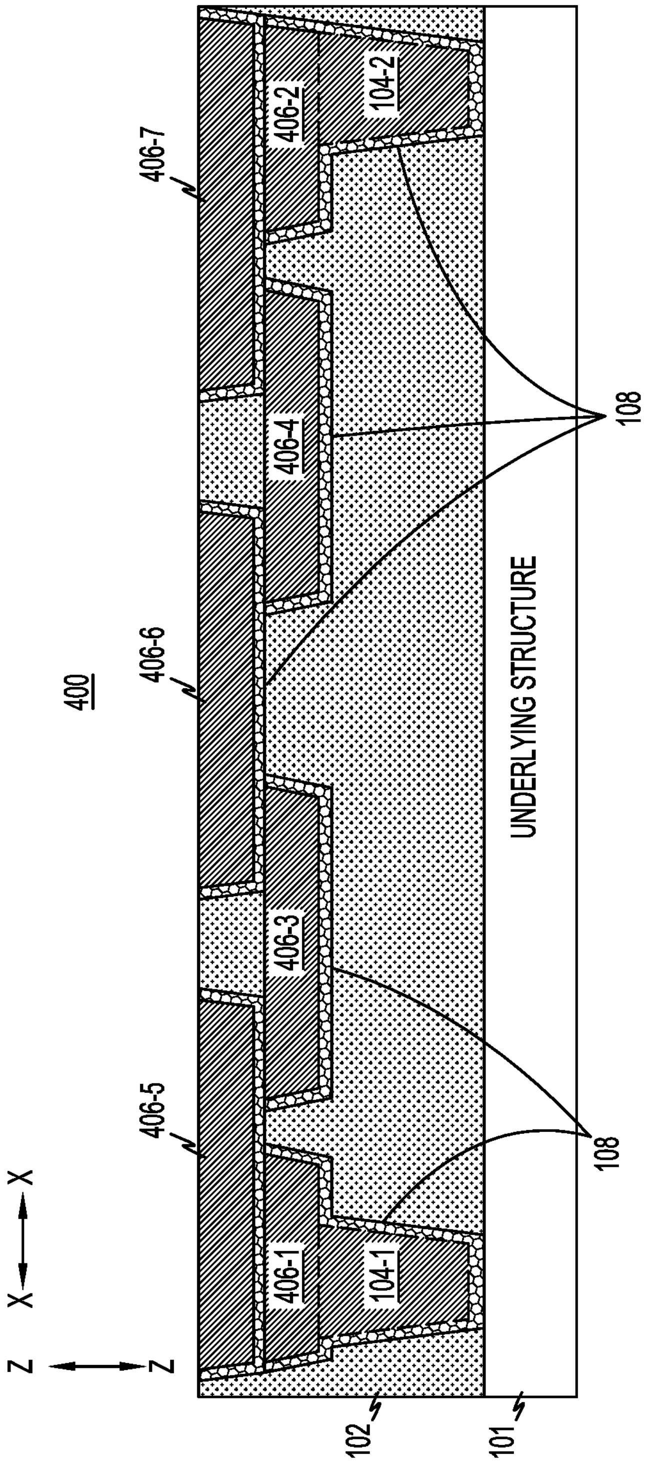
FIG. 4 depicts a side cross-sectional view of a structure with stacked interconnects in a metal line level with multiple segments, according to an embodiment of the invention.

The process flow of FIGS. 1A-2B illustrates the formation of an Mx line level that uses just two line segments in the second portion (e.g., the Mx(A) portion) to connect three line segments in the first portion (e.g., the Mx(B) portion). It should be appreciated, however, that there may be more line segments in the first and second portions of the Mx line level, depending on the distance which needs to be covered and the critical length. For example, a 100 μm connection wire can be broken down into 20 5 μm "lower" line segments (e.g., in the Mx(B) portion) and 19 "upper" line segments (e.g., in the Mx(A) portion). FIG. 4, as another example, shows a side cross-sectional view 400 of a structure which includes four line segments 406-1, 406-2, 406-3 and 406-4 in the first portion of a line level (e.g., the Mx(B) portion of an Mx line level), which are connected to one another using three line segments 406-5, 406-6 and 406-7 in the second portion of the line level (e.g., the Mx(A) portion of the Mx line level). Each of the line segments 406-1, 406-2, 406-3 and 406-4 may have similar sizing and spacing therebetween as the line segments 106-1, 106-2 and 106-3 described above, and each of the line segments 406-5, 406-6 and 406-7 may have similar sizing and spacing therebetween as the line segments 106-4 and 106-5 described above. The particular number of line segments in the first and second portions of a stacked interconnect structure for a particular line level (e.g., an Mx line level) may vary as needed based on the total length which needs to be traversed, the EM properties of the interconnect material used for the line segments, etc.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOS s), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Figure 5:
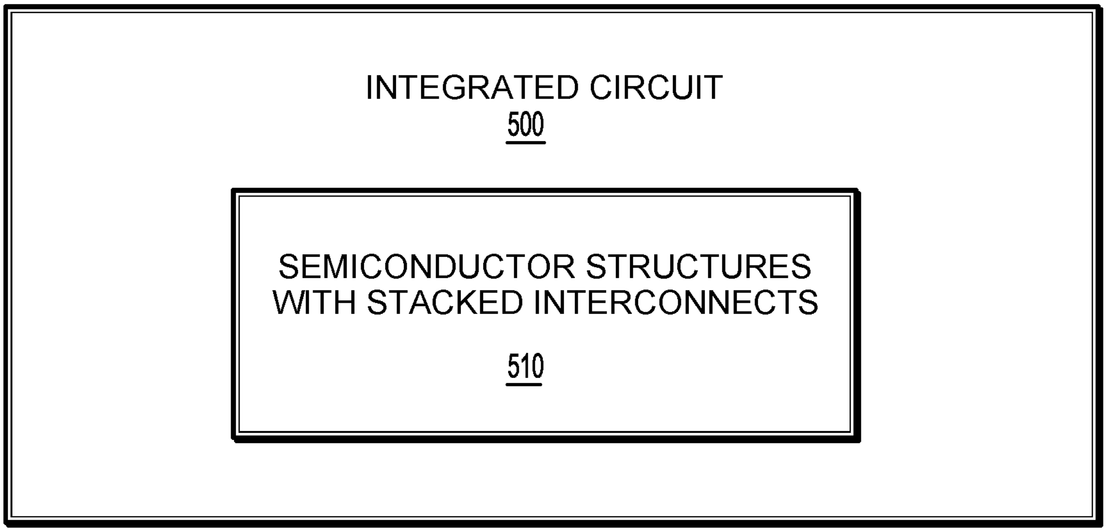
FIG. 5 depicts an integrated circuit comprising one or more semiconductor structures with stacked interconnects, according to an embodiment of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. FIG. 5 shows an example of an integrated circuit 500 which includes one or more semiconductor structures 510 with stacked interconnects.

In some embodiments, a semiconductor structure comprises a first portion of an interconnect line comprising a first conducting line segment and a second conducting line segment separated by an isolating layer, and a second portion of the interconnect line comprising a third conducting line segment vertically stacked over at least a portion of the first conducting line segment and at least a portion of the second conducting line segment.

The third conducting line segment in the second portion of the interconnect line electrically connects the first conducting line segment and the second conducting line segment in the first portion of the interconnect line.

The first portion of the interconnect line and the second portion of the interconnect line are part of a same interconnect level of an interconnect structure.

The interconnect line may provide at least a portion of a front side power distribution network, or at least a portion of a back side power distribution network.

The first conducting line segment may be connected to a first via and the second conducting line segment may be connected to a second via. At least one of the first via and the second via may be coupled to at least one additional interconnect line, or to at least a portion of an active device structure.

The first portion of the interconnect line may further comprise a fourth conducting line segment separated from the second conducting line segment by the isolating layer, and the second portion of the interconnect line may further comprise a fifth conducting line segment vertically stacked over at least a portion of the second conducting line segment and the fourth conducting line segment. The third conducting line segment and the fifth conducting line segment are separated by the isolating layer.

In some embodiments, an interconnect structure comprises a stacked interconnect line, the stacked interconnect line comprising a first portion comprising two or more conducting line segments separated by an isolating layer and a second portion vertically stacked over the first portion, and one or more vias connecting the stacked interconnect line with an additional structure.

The additional structure may comprise an additional interconnect line. The stacked interconnect line may be in a first line level of the interconnect structure and the additional interconnect line may be in a second line level of the interconnect structure.

The additional structure may comprise an active device structure. The active device structure may comprise one or more transistors.

In another embodiment, an integrated circuit comprises a semiconductor structure comprising a first portion of an interconnect line comprising a first conducting line segment and a second conducting line segment separated by an isolating layer, and a second portion of the interconnect line comprising a third conducting line segment vertically stacked over at least a portion of the first conducting line segment and at least a portion of the second conducting line segment.

The third conducting line segment in the second portion of the interconnect line electrically connects the first conducting line segment and the second conducting line segment in the first portion of the interconnect line.

The first portion of the interconnect line and the second portion of the interconnect line are part of a same interconnect level of an interconnect structure.

The first portion of the interconnect line may further comprise a fourth conducting line segment separated from the second conducting line segment by the isolating layer, and the second portion of the interconnect line may further comprise a fifth conducting line segment vertically stacked over at least a portion of the second conducting line segment and the fourth conducting line segment. The third conducting line segment and the fifth conducting line segment are separated by the isolating layer.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms “approximately” or “substantially” as used herein with regard to thicknesses, widths, percentages, ranges, temperatures, times and other process parameters, etc., are meant to denote being close or approximate to, but not exactly. For example, the term “approximately” or “substantially” as used herein implies that a small margin of error is present, such as ±5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:

a first portion of an interconnect line comprising a first conducting line segment and a second conducting line segment separated by an isolating layer; and a second portion of the interconnect line comprising a third conducting line segment vertically stacked over the entirety of the first conducting line segment and over a portion of the second conducting line segment;

wherein a bottom surface of the third conducting line segment is separated by a liner layer that continuously extends in parallel with the bottom surface of the third conducting line segment and with respective coplanar top surfaces of the first conducting line segment, the second conducting line segment, and the isolating layer.

2. The semiconductor structure of claim 1, wherein the third conducting line segment in the second portion of the interconnect line electrically connects the first conducting line segment and the second conducting line segment in the first portion of the interconnect line.

3. The semiconductor structure of claim 1, wherein the first portion of the interconnect line and the second portion of the interconnect line are part of a same interconnect level of an interconnect structure.

4. The semiconductor structure of claim 1, wherein the interconnect line provides at least a portion of a front side power distribution network.

5. The semiconductor structure of claim 1, wherein the interconnect line provides at least a portion of a back side power distribution network.

6. The semiconductor structure of claim 1, wherein the first conducting line segment is connected to a first via.

7. The semiconductor structure of claim 6, wherein the first via is coupled to at least one additional interconnect line.

8. The semiconductor structure of claim 6, wherein the first via is coupled to at least a portion of an active device structure.

9. An interconnect structure comprising:

a stacked interconnect line, the stacked interconnect line comprising a first portion comprising two or more conducting line segments separated by an isolating layer and a second portion vertically stacked over the first portion, wherein the second portion is vertically stacked over the entirety of a first conducting line segment of the first portion and over a portion of a second conducting line segment of the first portion; and a via connecting the first conducting line segment with an additional structure;

wherein a bottom surface of a third conducting line segment of the second portion is separated by a liner layer that continuously extends in parallel with the bottom surface of the third conducting line segment and with respective coplanar top surfaces of the first conducting line segment, the second conducting line segment, and the isolating layer.

10. The interconnect structure of claim 9, wherein the additional structure comprises an additional interconnect line.

11. The interconnect structure of claim 10, wherein the stacked interconnect line is in a first line level of the interconnect structure and the additional interconnect line is in a second line level of the interconnect structure.

12. The interconnect structure of claim 9, wherein the additional structure comprises an active device structure.

13. The interconnect structure of claim 12, wherein the active device structure comprises one or more transistors.

14. An integrated circuit comprising:

a semiconductor structure comprising:

a first portion of an interconnect line comprising a first conducting line segment and a second conducting line segment separated by an isolating layer; and a second portion of the interconnect line comprising a third conducting line segment over the entirety of the first conducting line segment and over a portion of the second conducting line segment;

wherein a bottom surface of the third conducting line segment is separated by a liner layer that continuously extends in parallel with the bottom surface of the third conducting line segment and with respective coplanar top surfaces of the first conducting line segment, the second conducting line segment, and the isolating layer.

15. The integrated circuit of claim 14, wherein the third conducting line segment in the second portion of the interconnect line electrically connects the first conducting line segment and the second conducting line segment in the first portion of the interconnect line.

16. The integrated circuit of claim 14, wherein the first portion of the interconnect line and the second portion of the interconnect line are part of a same interconnect level of an interconnect structure.

* * * * *